(12) United States Patent
Fackenthal

(10) Patent No.: US 6,748,482 B1
(45) Date of Patent: Jun. 8, 2004

(54) MULTIPLE NON-CONTIGUOUS BLOCK ERASE IN FLASH MEMORY

(75) Inventor: Richard E. Fackenthal, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 130 days.

(21) Appl. No.: 09/670,849

(22) Filed: Sep. 27, 2000

(51) Int. Cl.$^7$ .............................................. G06F 12/00
(52) U.S. Cl. .............. 711/103; 365/185.11; 365/185.79
(58) Field of Search ...................... 711/103; 365/185.11, 365/185.29

(56) References Cited

U.S. PATENT DOCUMENTS

| | | | | |
|---|---|---|---|---|
| 5,418,752 A | * | 5/1995 | Harari et al. | 365/185.09 |
| 5,648,929 A | * | 7/1997 | Miyamoto | 365/185.29 |
| 6,047,352 A | * | 4/2000 | Lakhani et al. | 711/103 |
| 6,088,264 A | | 7/2000 | Hazen et al. | |
| 6,097,666 A | * | 8/2000 | Sakui et al. | 365/185.11 |
| 6,115,292 A | * | 9/2000 | Fukuda et al. | 365/185.29 |
| 6,172,915 B1 | * | 1/2001 | Tang et al. | 365/185.29 |
| 6,598,113 B2 | * | 7/2003 | Roohparvar | 711/103 |

OTHER PUBLICATIONS

Finnin et al. "Prefix, infix, postfix, mixfix" http://www.c-see.umbc.edu/331/fall00/homework/mixfix.shtml, Fall 2000.*

B. Dipert and M. Levy, "Designing With Flash Memory," pp. i–XV, 133–185 (Annabooks 1993).

* cited by examiner

Primary Examiner—Mano Padmanabhan
Assistant Examiner—Paul Baker
(74) Attorney, Agent, or Firm—Blakely, Sokoloff, Taylor & Zafman LLP

(57) ABSTRACT

A flash memory block erase operation permits multiple blocks to be erased simultaneously, even if the blocks are non-contiguous. A command sequence outputs multiple block addresses to the flash memory controller, which stores indicators of those addresses. When the command is completed, the flash memory initiates a block erase on all the specified blocks. The special command can be a multi-cycle bus command, made up of a sequence of single-cycle bus transfers using a standard format for the bus. The flash memory interface can contain the capability to interpret the command, retain the information transferred during the multiple bus cycles, and initiate the block erase operation after all the block addresses for that command have been received.

28 Claims, 6 Drawing Sheets

Fig. 1        Prior Art

MULTIPLE NON-CONTIGUOUS BLOCK ERASE IN FLASH MEMORY

BACKGROUND OF THE INVENTION

1. Field of the Invention

The invention pertains generally to computer systems. In particular, it pertains to erasing blocks of flash memory.

2. Description of the Related Art

Flash memory provides a non-volatile fast-access storage medium that can be rewritten in-circuit after first erasing the old data. However, due to the characteristics of flash memory, data can be erased only in blocks, which are typically between 8 kilobytes (KB) and 128 KB in size. Once data has been written into a particular byte location, that data cannot be changed without first erasing the byte, which requires erasing the entire block in which the byte is located. This characteristic of flash memory makes it unsuitable for many applications, but suitable for applications that load a medium-to-large amount of data, retain that data for some period of time without change, and eventually delete that data in its entirety. One such application is a digital audio player.

A digital audio player is a small appliance that contains one or more flash memory components, and stores music or other audio content in one of several industry-standard formats. The user downloads songs or other pieces of music (commonly called "tracks") one at a time, from the source to the player, until the flash memory is occupied with content. Each downloaded track occupies a number of erase blocks in the flash memory, the number depending on the length of the track. An "erase block" is the smallest unit in the flash memory that can be erased at once, and will be referred to in this document simply as a "block". The blocks that comprise a track are generally not physically contiguous—one track may occupy blocks that are scattered throughout the flash memory device. However, they are in some way logically connected, for example through a linked-list—each block containing a data structure which points to the location of the next logical block within the track.

After downloading, the user may wish to delete one track and replace it with another. This results in the erasure of all of the blocks associated with that track. This process can take a long time, depending on the number and size of track(s) to be erased. With conventional flash memory technology, a typical 4-minute track can take about 30 seconds to erase. This wait may be unpalatable to the end user.

Currently, flash memory components have one erase command at the user interface. The user (system software) issues a single-block erase command to the device by clocking in a command with a single block address. The device then performs an erase operation on that block. When the erase operation is complete, the system software issues the next erase command for the next block, and so on. Thus, all blocks within a track are erased serially, which causes the excessive erase times noted above.

FIG. 1 illustrates this serial block erase process 10. At step 11, the flash memory controller receives a single-block erase command with the address of the block to be erased. At step 12, a confirm command is received, which triggers the flash memory to erase the specified block at step 13. Control then returns to step 11 to receive another block Erase command with the block address of the next block to erase. This loop is repeated as many times as there are blocks to erase.

DETAILED DESCRIPTION OF THE INVENTION

The invention comprises a new flash memory interface that permits multiple blocks to be erased simultaneously. The interface can include a new flash memory command that indicates a multi-block erasure, and circuitry to interpret this command and determine which blocks to erase. The command can allow the user to clock multiple block addresses into the memory. The number of blocks can vary and may be as great as the number of physical blocks in the flash memory.

Using the multi-cycle command format that is common with flash memory devices, the user can send an initial command cycle to the device, telling the device that the following several command cycles will contain block addresses. The next cycle(s) can specify those block addresses. Finally, a "confirm command" cycle can be issued, which is a command indicating that all block addresses have been transferred and the command sequence is over. The name "confirm command" is used simply to denote a sequence termination command that, in essence, confirms the end of the command sequence. Other names can also be used without departing from the spirit of the invention. During this multi-cycle command sequence, the block addresses are received by the flash memory interface and can be retained in a series of latches. Upon receipt of the confirm command, the transfers are complete and the device begins the multiple block erase operation. Since the device can now know all the blocks that are to be erased, the internal erase controller can manage simultaneous erasure of all blocks.

The invention speeds up the erase process by allowing multiple blocks to be erased simultaneously. Furthermore, the blocks to be erased can be non-contiguous—they may comprise a set of blocks scattered randomly throughout the flash memory device. This capability benefits digital audio applications, where the user may desire to erase a track without disturbing others, and the track comprises many non-contiguous blocks. Other applications, such as digital telephone voicemail machines, can also benefit from this capability. A feature of this invention can be a multi-cycle command that allows the system to specify multiple blocks, load identifiers of those blocks into the device, and then direct the device to erase those blocks simultaneously. Each cycle can be in the format of a standard command cycle on the bus, and the flash memory device can interpret the sequence of commands as a related group to perform the block erase function. The circuitry in the flash memory system can accumulate the specified block addresses, or indicators of those addresses, and initiate all erases when the command sequence is completed.

Figure 1:
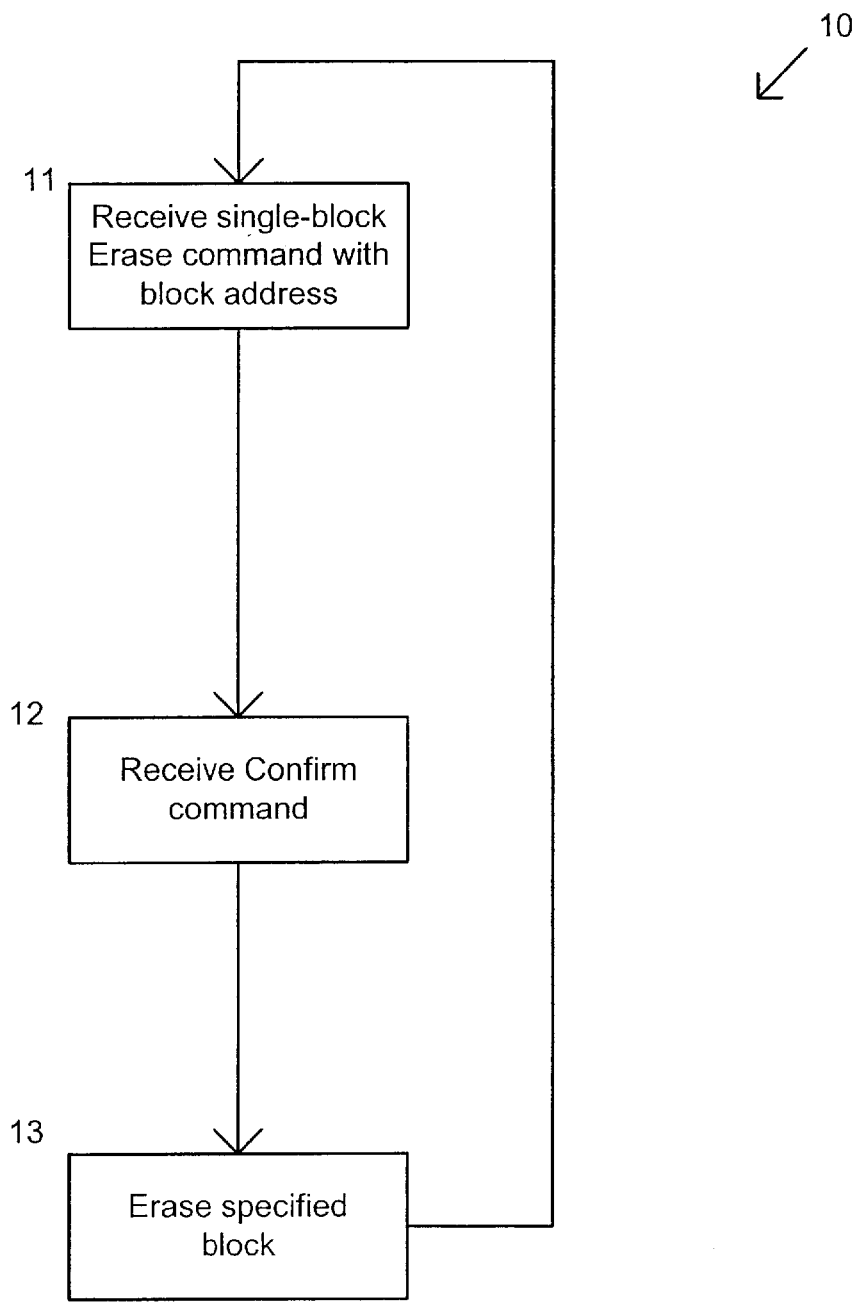
FIG. 1 shows a flow chart of a single-block erase operation of the prior art.
Figure 2:
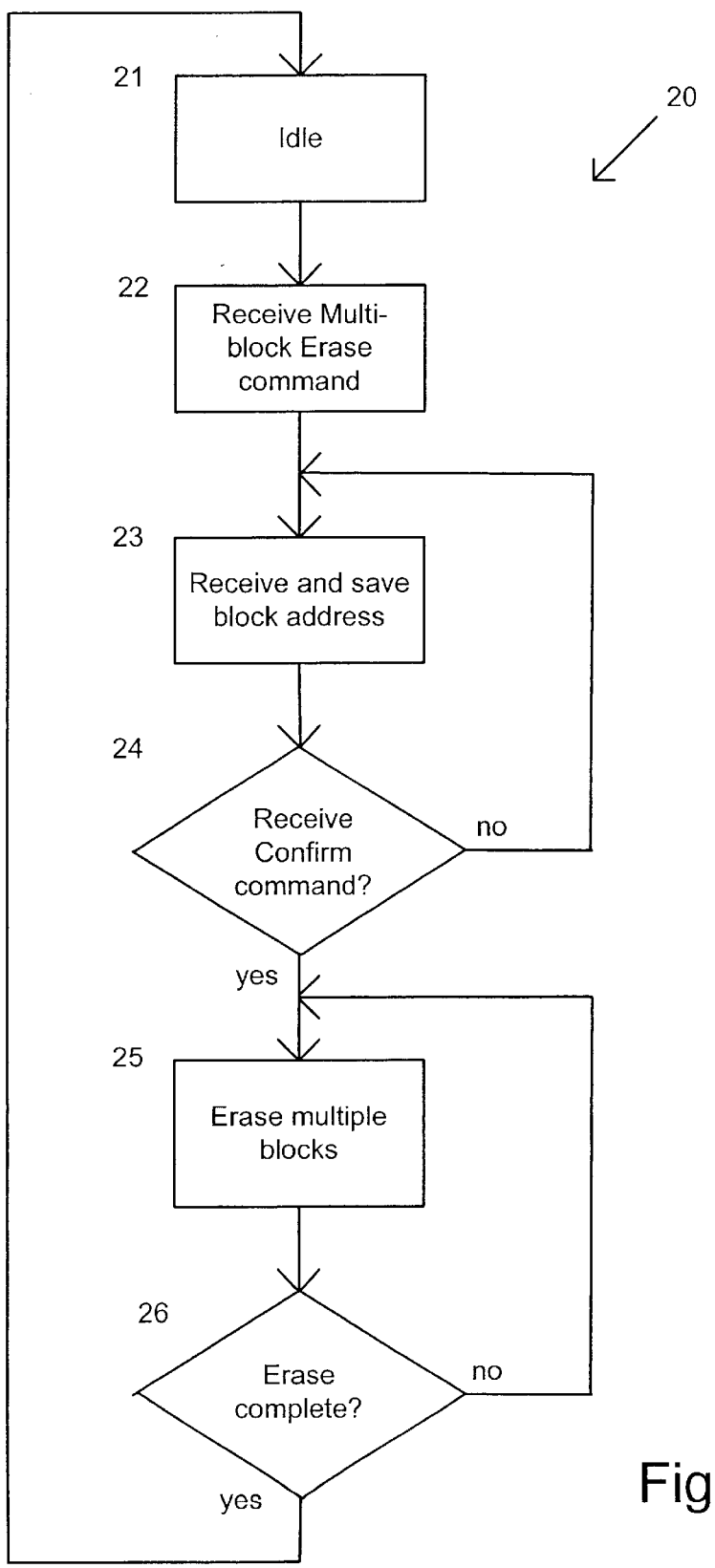
FIG. 2 shows a flow chart of a multi-block erase operation of the invention.

FIG. 2 shows a flow chart for a command sequence 20 that can be used by the flash controller, and can also serve as the basis for a state machine to control the command sequence. In the idle state at step 21, the device is waiting for commands. When the command, "Multi-block Erase" is received at step 22, the device begins to accept and save block addresses at step 23. As long as a Confirm command is not detected at step 24, the device keeps accepting block addresses at step 23. When a Confirm command is detected at step 24, the device begins the multiple block erase operation at step 25, erasing all of the blocks that were addressed in the previous command cycles. The erase function is a comparatively lengthy operation, and can continue until complete. Finally, when the erase function is complete at step 26, flow can return to the idle state of step 21.

Various error conditions (such as a timeout before a Confirm command is received) might occur during the command sequence that can cause the sequence to abort and return to the idle state at step 21 without erasing any blocks. For simplicity, these are not shown or described. A person of ordinary skill in the art should be able to implement such error-abort functions.

Figure 3:
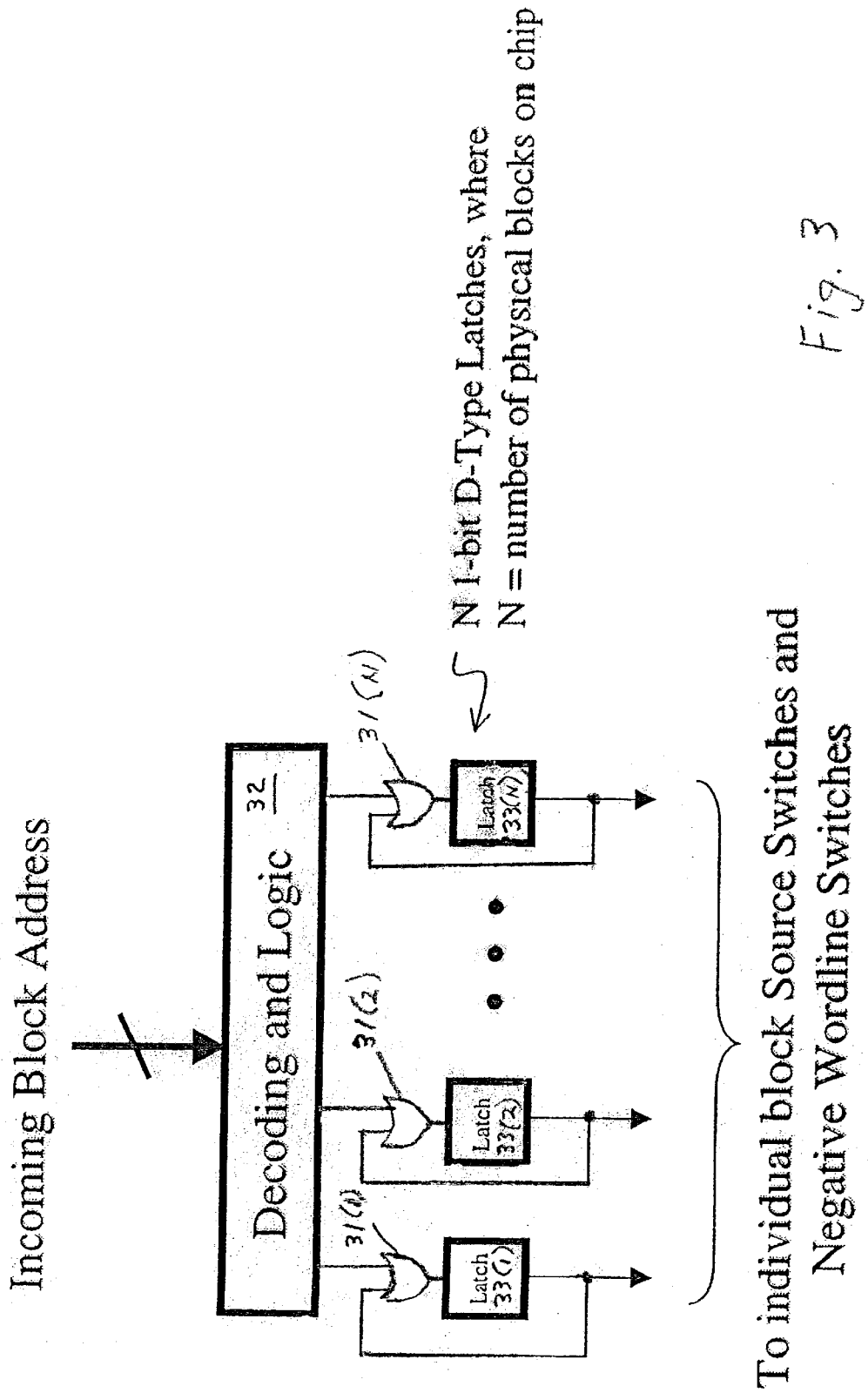
FIG. 3 shows a diagram of the command decode and block address latching functions.

FIG. 3 shows a schematic for decoding and storing the block addresses while the block addresses are being received during the command sequence. After the first command cycle, each subsequent cycle can present a block address to the device. The address can be decoded by decoding logic 32, which can convert that address into a form suitable for storing. The addresses could be stored in their original format (a binary number), which would require a table of entries with enough bit width to contain the address and as many entries as there are blocks in the flash memory. However, more efficient use of circuit real estate can be realized by designating a simple latch for each erasable block, and storing a representation of the address by storing a logic '1' in each latch whose associated block is to be erased. The number of latches 33(1)–33(N) can be the same as the number of physical blocks existing in the flash memory. Each block can be associated with a specific one of those latches. If a block is addressed during the command sequence, that block's corresponding latch can be loaded with a logic "1". Otherwise, the latch can be loaded with whatever its previous data was, as shown by the looping connections from the output of the latches to the OR gates 31(1)–31(N) at the inputs to of the latches. To initialize the latches, they can all be reset to a logic "0" before receiving any addresses in the command sequence. This "store and loop" design is only one way to write and save the identification of the specified blocks in the latches. As will be appreciated by a person of ordinary skill in the art, there are other circuits that will permit writing and saving the contents of the latches, and these are included within the scope of the invention.

Once the Confirm command is given, the erase controller can take over and look at the signals from the outputs of individual latches 33(1)–33(N). These signals can gate the individual block Source Switches and Negative Wordline Switches (not shown). The Source Switches and Negative Wordline Switches are conventional circuits that must be ON for an individual block to be erased. They are known elements in flash memory design and are not further described herein. By getting simultaneous outputs from multiple ones of latches 33(1)–33(N), the flash memory device is able to simultaneously select certain ones of the Source Switches and Negative Wordline Switches, and the erase controller can erase those specified blocks simultaneously based on which Source Switches and Negative Wordline Switches are selected by latches 33(1)–33(N).

Figure 4:
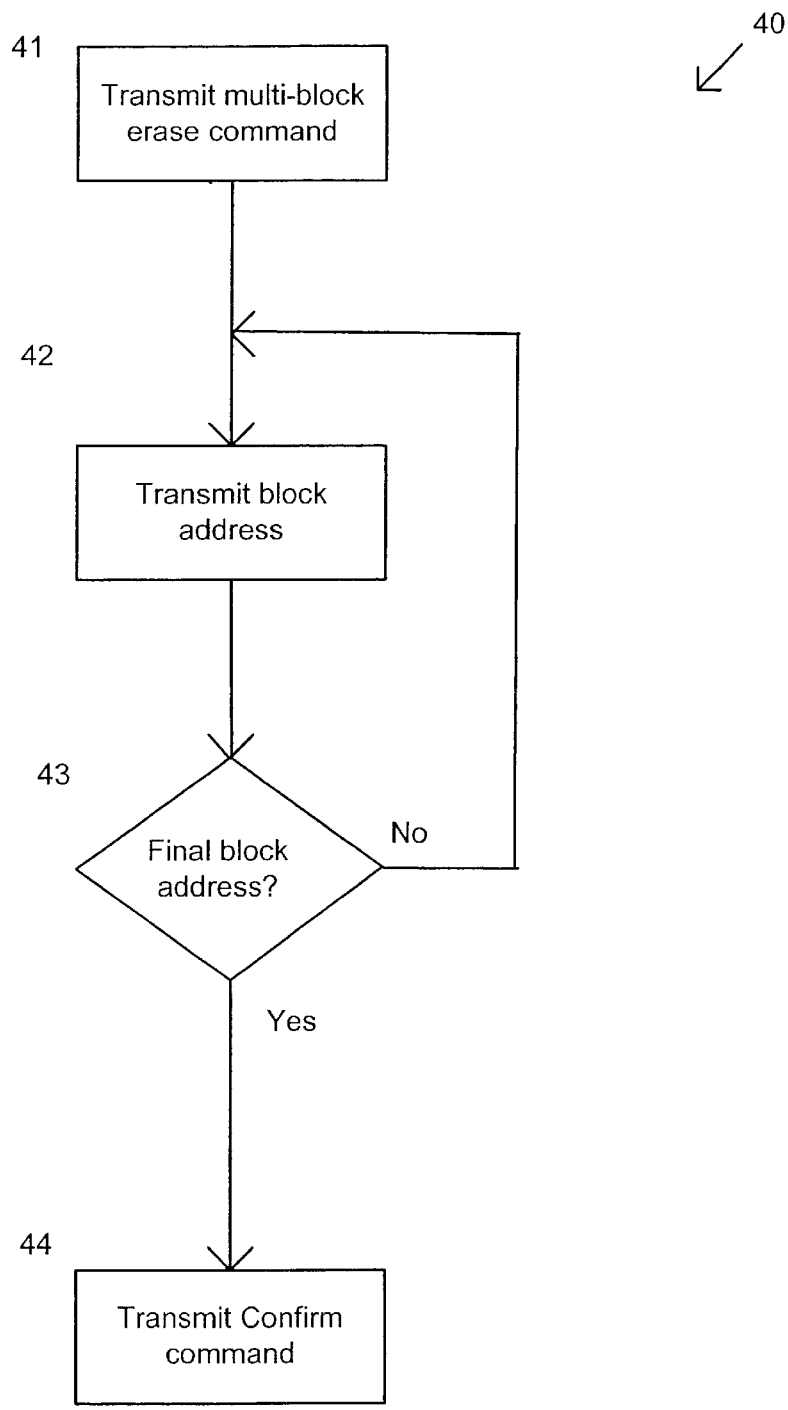
FIG. 4 shows a flow chart of the software for issuing a multi-block erase command.

FIG. 4 shows a flow chart 40 of an operation that can be followed by the software in the processor used to erase the blocks. At step 41, the software can transmit the multi-block erase command to the flash memory device on the first cycle of the command sequence. In a subsequent cycle, the software can transmit a block address at step 42. As long as the final block address has not been transmitted, as detected at step 43, the software can continue transmitting block addresses at step 42. Once the final block address has been transmitted, the software can transmit the Confirm command at step 44, which can directs the flash memory to erase all the specified blocks.

Figure 5:
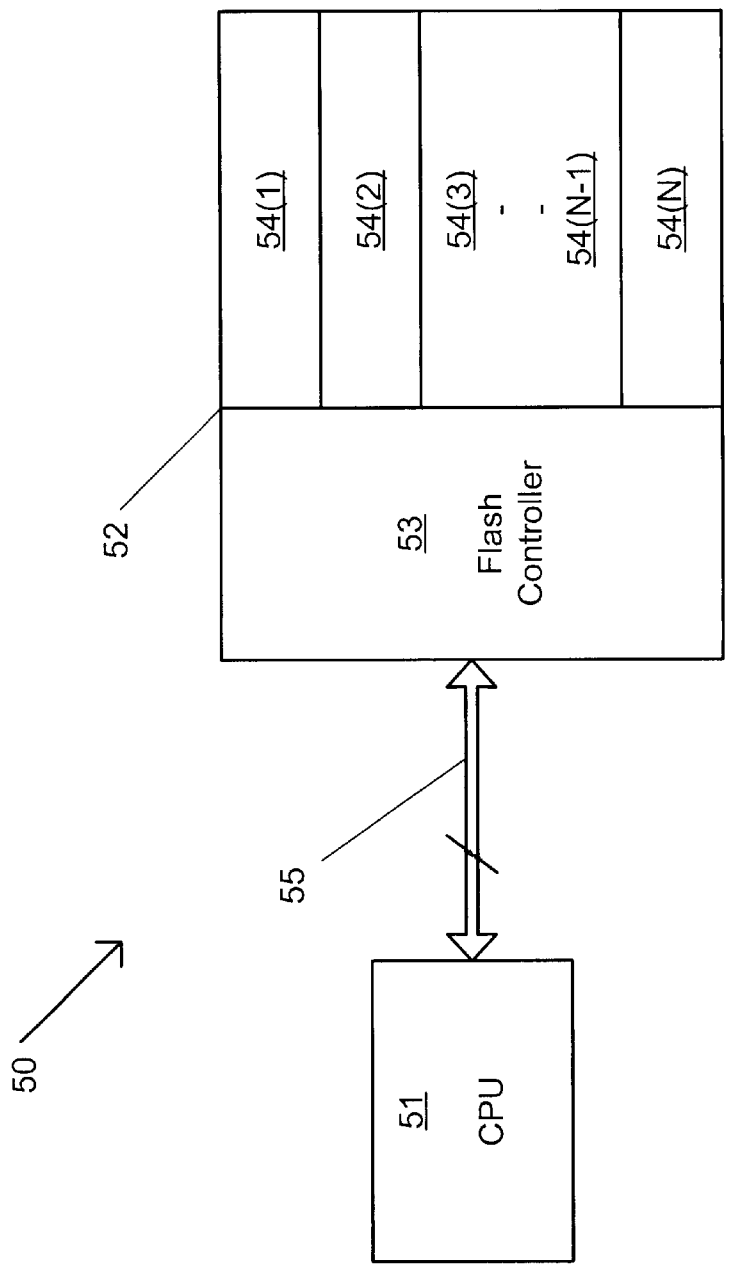
FIG. 5 shows a portion of a system of the invention.

FIG. 5 shows a block diagram of the relevant portions of a system 50 of the invention. CPU 51, under the direction of appropriate software, can issue commands and data to flash memory system 52 over bus 55. Flash controller 53 can receive the commands, store the address indicators, configure the control signals, and perform a block erase on selected ones of blocks 54(1)–54(N).

Figure 6:
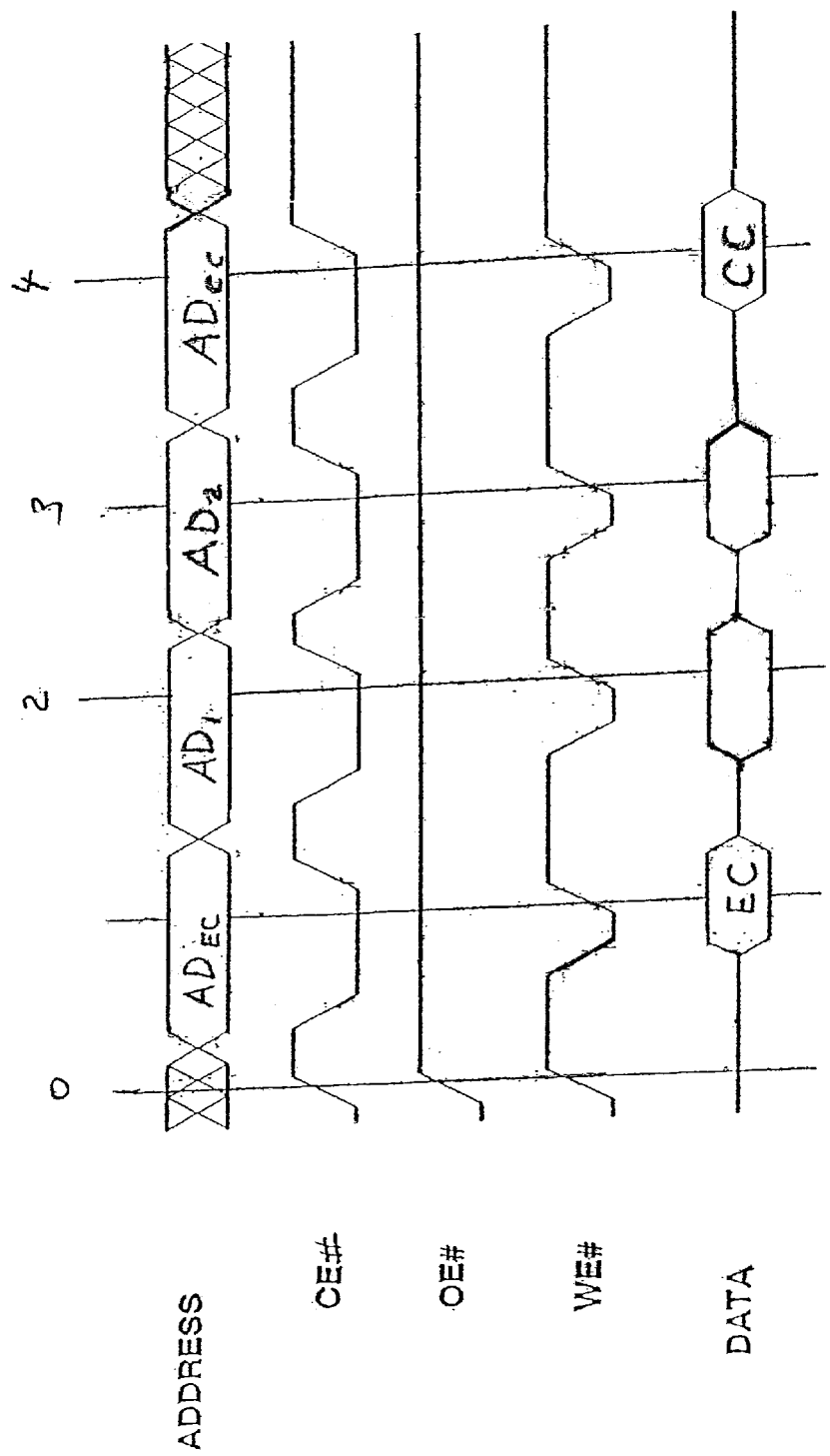
FIG. 6 shows a timing diagram of the signals on the flash memory bus.

It should be understood that, in addition to block erase, there are various other commands that can be issued by CPU 51 to flash memory 52 over bus 55, such as Write Data, Read Data, Read Status, etc. Most of these are not part of the invention, and in at least one embodiment may continue to operate in the conventional manner. FIG. 6 shows a timing diagram of the bus signals during a command sequence for one embodiment of the invention. In this particular embodiment, an asynchronous bus is used, meaning that it does not use a clock signal to synchronize signals. Instead, the Write Enable (WE#) signal is used to provide a timing reference for examining the other signal lines in a command. The "#" symbol on this and other signals indicates a low-active signal, i.e., the indicated function is asserted when the signal is low. When WE# goes low, a write operation on the bus is indicated, and when WE# goes from low to high, as indicated by the vertical lines in FIG. 6, the address and data lines are examined by the target device. On this bus, the Chip Enable (CE#) signal can select the target device so that the device can recognize and respond to the operation in progress. When CE# is high (de-asserted) the device is not selected and can be placed in a low-power standby mode. Each device on the bus can have its own separate CE# line, so normally only the device intended to receive the command will be enabled. The signal Output Enable (OE#) can be used to enable the data line drivers of the selected device so that it can place data on the data lines. This typically only occurs during a read operation. Since the block erase function is a write operation, the OE# signal in FIG. 6 is shown deactivated (high) throughout the period in question.

Multiple address lines AD provide the address(es) of the target device for the command. For a flash memory device, the AD lines can address any location within the range of the flash memory. Since a flash memory is typically embedded in the address scheme of a much larger memory system, the memory range in the flash memory will typically be a small subset of the range that can be addressed by address lines AD. Multiple flash memory devices can be on the bus, each with its own address range.

Multiple DATA lines provide the data to be transferred to or from the target device. In one embodiment, there are sixteen bi-directional DATA lines for data and command transfers. Data can be transferred from the CPU to a target device over this bus by placing an address of the device on the ADDRESS lines and selecting the device by asserting its CE# line, as shown at cycle 1. The data to be written can be placed on the DATA lines. When the WE# line is asserted and then de-asserted, the selected device can read the address and data lines, and perform whatever action is indicated by the command.

In the invention, a series of these commands can be combined into a command sequence, so that CE# and WE# will be activated multiple times, with each activation being used to transfer information over the bus. For example, after activating the CE# line to the flash memory device, a multi-block Erase Command can be initiated by placing any address within the flash memory on the ADDRESS lines, indicated in the figure as $AD_{EC}$, and placing a specific code on the DATA lines, indicated in the figure by EC. In one embodiment, the code 20($h$) is placed on the lower byte of the DATA lines to indicate the multi-block erase command. When this code is read by the flash memory controller, the controller knows that a multi-block erase function is being initiated, and that the following commands received by the flash memory controller will identify the blocks to be erased. At the completion of this first cycle, CE# and WE# can both be deactivated, and the bus can become available for other transfers by other devices.

At a later time, shown as cycle 2 in FIG. 6, CE# and WE# can again be activated to initiate another write function to the flash memory controller on the bus. This second cycle in the sequence is devoted to transferring an address, shown as $AD_1$, of one of the blocks to be erased. The block can be specified by placing its address on the ADDRESS lines. In one embodiment, any address within that particular block can be placed on the ADDRESS lines, and the flash memory controller will interpret the command to mean the particular block containing that address is one of the blocks to be erased. This can be accomplished simply by ignoring the lower bits of the address, which specify a location within the block, so that the remaining address bits uniquely identify the block itself. During this cycle, the DATA lines can be examined for a Confirm command. If it is not seen, then this cycle can be interpreted as an address cycle as described above.

In other subsequent cycles, other block addresses can be conveyed in this manner. Cycle 3 shows a second block address, $AD_2$, being transferred in the same manner as was $AD_1$. After the last block address has been transferred in this manner, a Confirm command can be issued by placing another specific bit pattern on the DATA lines, such as D0($h$) on the lower eight bits of the data lines. The Confirm command is shown as CC in cycle 4 of FIG. 6. Again, the ADDRESS lines during the CC command can be any address within the flash memory. The Confirm command is the command that tells the flash memory that the command sequence is now complete. This can trigger the flash memory to begin the block erase process on the blocks specified during the previous commands in the sequence.

The block erase process may take a full second or more, and the flash memory might not be available for reading or writing data during that time. The software can determine when the erase process is complete by reading the status of the flash memory, which can be done with a conventional READ STATUS command (not shown).

In the just-described embodiment, the primary distinction between a command that transfers a block number, and a command that signifies Erase or Confirm, is the presence of the command code on the DATA lines. For this reason, it is important to make sure the data lines do not inadvertently create a viable command when a block address command was intended. This can be accomplished by placing a code (such as all 0's) on the data lines during a block address transfer that does not correspond to any code that would cause the transfer to terminate prematurely.

For clarity, FIG. 6 shows the aforementioned command sequence taking place over four consecutive cycles on the bus (from the processor's point of view). However, it is not necessary to use consecutive cycles. Since the CE# line to the flash memory controller is inactive between the command cycles that address the flash memory controller, that controller has no knowledge of what transpires on the bus during those inactive periods. Thus it is possible for other devices to use the bus between the memory controller cycles. For simplicity, this possibility is not illustrated in FIG. 6, and those of skill in the art will appreciate that the presence of other bus cycles to other bus devices would have no effect on the operation of the controller, other than possibly to increase the total elapsed time it takes to complete the command sequence.

An asynchronous bus with particular signal configurations has been used to demonstrate an embodiment of the invention. However, another bus, including a synchronous bus, could be used without departing from the spirit of the invention.

Various aspects of the invention can be implemented in circuitry or as a method. The invention can also be implemented as instructions stored on a machine-readable medium, which can be read and executed by at least one processor to perform the functions described herein. A machine-readable medium includes any mechanism for storing or transmitting information in a form readable by a machine (e.g., a computer). For example, a machine-readable medium can include read only memory (ROM); random access memory (RAM); magnetic disk storage media; optical storage media; flash memory devices; electrical, optical, acoustical or other form of propagated signals (e.g., carrier waves, infrared signals, digital signals, etc.), and others.

The foregoing description is intended to be illustrative and not limiting. Variations will occur to those of skill in the art. Those variations are intended to be included in the invention, which is limited only by the spirit and scope of the appended claims.

I claim:

1. A method, comprising:
    transmitting over a bus to a flash memory device an erase command that is a first command of a command sequence;
    transmitting over the bus to the flash memory device a plurality of addresses designating a plurality of memory blocks of the flash memory device, wherein the plurality of addresses are part of the command sequence;
    transmitting over the bus to the flash memory device a sequence termination command to initiate simultaneous erasure of the plurality of memory blocks of the flash memory device, wherein the sequence termination command is a last command of the command sequence, wherein the command sequence is discontinuous, wherein at least one bus cycle between the first command and the last command is available for other uses.

2. The method of claim 1, wherein the other uses are with respect to other devices coupled to the bus.

3. The method of claim 1, wherein the plurality of memory blocks includes memory blocks that are non-contiguous.

4. The method of claim 1, wherein the plurality of memory blocks are contiguous.

5. The method of claim 1, wherein the sequence termination command comprises a confirm command.

6. The method of claim 1, wherein the bus is asynchronous.

7. The method of claim 6, wherein a write enable signal and a chip enable signal are used to control transmission of the command sequence to the flash memory.

8. The method of claim 7, wherein the chip enable signal is not active during the at least one bus cycle between the first command and the last command that is available for other uses.

9. The method of claim 1, wherein the bus is synchronous.

10. The method of claim 1, wherein the erase command comprises a first code sent on data lines of the bus, wherein the sequence termination command comprises a second code sent on the data lines of the bus, wherein the plurality of addresses designating the plurality of memory blocks are sent on address lines of the bus.

11. The method of claim 10, wherein all zeroes are sent on the data lines of the bus while the plurality of addresses designating the plurality of memory blocks are sent on the address lines of the bus.

12. The method of claim 1, wherein the plurality of addresses designating the plurality of memory blocks comprise one address from each of respective plurality of memory blocks.

13. A machine-readable medium having stored thereon instructions which when executed by a processor cause the processor to perform operations comprising:
    transmitting over a bus to a flash memory device an erase command that is a first command of a command sequence;
    transmitting over the bus to the flash memory device a plurality of addresses designating a plurality of memory blocks of the flash memory device, wherein the plurality of addresses are part of the command sequence;
    transmitting over the bus to the flash memory device a sequence termination command to initiate simultaneous erasure of the plurality of memory blocks of the flash memory device, wherein the sequence termination command is a last command of the command sequence, wherein the command sequence is discontinuous, wherein at least one bus cycle between the first command and the last command is available for other uses.

14. The machine-readable medium of claim 13, wherein the other uses are with respect to other devices coupled to the bus.

15. The machine-readable medium of claim 13, wherein the plurality of memory blocks includes two memory blocks that are non-contiguous.

16. The machine-readable medium of claim 13, wherein the plurality of memory blocks comprises two memory blocks that are contiguous.

17. The machine-readable medium of claim 13, wherein the sequence termination command comprises a confirm command.

18. The machine-readable medium of claim 13, wherein the bus is asynchronous.

19. The machine-readable medium of claim 13, wherein the bus is synchronous.

20. A system, comprising:
    a bus;
    a processor coupled to the bus;
    a flash memory controller coupled to the bus, comprising:
        circuitry to receive a command sequence from the processor over a range of bus cycles that includes bus cycles not used by the command sequence, wherein an erase command is the first command of the command sequence and a sequence termination command is a last command of the command sequence;
        circuitry to receive a plurality of addresses from the processor that are part of the command sequence, wherein the plurality of addresses designate a plurality of memory blocks of a flash memory array coupled to the flash memory controller;
        circuitry to simultaneously erase the plurality of memory blocks in response to receipt of the sequence termination command;
    circuitry that permits the bus to be used by other devices during bus cycles not used by the command sequence.

21. The system of claim 20, wherein the plurality of memory blocks include non-contiguous blocks.

22. The system of claim 20, wherein the plurality of memory blocks are contiguous.

23. The system of claim 20, wherein the bus is asynchronous.

24. The system of claim 20, wherein the bus is synchronous.

25. The system of claim 20, wherein the circuitry that permits the bus to be used by other devices comprises chip enable circuitry.

26. The system of claim 20, wherein the erase command comprises a first code sent on data lines of the bus, wherein the sequence termination command comprises a second code sent on the data lines of the bus, wherein the plurality of addresses designating the plurality of memory blocks are sent on address lines of the bus.

27. The system of claim 20, wherein the plurality of addresses designating the plurality of memory blocks comprises one address from each of respective plurality of memory blocks.

28. The system of claim 20, wherein the circuitry to receive a plurality of addresses comprises a plurality of latches associated with respective memory blocks of the flash memory.

* * * * *